United States Patent
Hall et al.

(10) Patent No.: US 8,732,942 B2
(45) Date of Patent: May 27, 2014

(54) METHOD OF FORMING A HIGH SPEED INTERCONNECT

(75) Inventors: Stephen H. Hall, Hillsboro, OR (US); Bryce D. Horine, Aloha, OR (US); Gary A. Brist, Yamhill, OR (US); Howard Heck, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 619 days.

(21) Appl. No.: 12/055,443

(22) Filed: Mar. 26, 2008

(65) Prior Publication Data

US 2008/0172872 A1 Jul. 24, 2008

Related U.S. Application Data

(62) Division of application No. 11/319,875, filed on Dec. 27, 2005, now abandoned.

(51) Int. Cl.
*H05K 3/02* (2006.01)
*H05K 3/10* (2006.01)

(52) U.S. Cl.
USPC .... 29/846; 29/830; 174/117 AS; 343/700 MS

(58) Field of Classification Search
USPC .............. 29/830, 831, 846, 852; 174/117 AS, 174/253, 255, 256; 257/208, 664; 333/5, 333/26, 156, 161, 238, 246; 343/700 MS; 716/15
See application file for complete search history.

(56) References Cited

U.S. PATENT DOCUMENTS

| | | | |
|---|---|---|---|
| 5,426,399 A | 6/1995 | Matsubayashi et al. | |
| 5,732,173 A | 3/1998 | Bylander et al. | |
| 6,072,699 A | 6/2000 | Horine | |
| 6,144,576 A | 11/2000 | Leddige et al. | |
| 6,175,239 B1 | 1/2001 | Hall | |
| 6,249,142 B1 | 6/2001 | Hall et al. | |
| 6,346,842 B1 | 2/2002 | Hall, Jr. et al. | |
| 6,353,539 B1 | 3/2002 | Horine et al. | |
| 6,362,973 B1 | 3/2002 | Leddige et al. | |
| 6,366,466 B1 | 4/2002 | Leddige et al. | |
| 6,414,574 B1 | 7/2002 | Knochel et al. | |
| 6,429,383 B1 | 8/2002 | Sprietsma et al. | |
| 6,445,345 B1 * | 9/2002 | Kamimoto et al. | 343/700 MS |
| 6,477,614 B1 | 11/2002 | Leddige et al. | |
| 6,587,912 B2 | 7/2003 | Leddige et al. | |
| 6,621,384 B1 * | 9/2003 | Handforth et al. | 333/238 |

(Continued)

FOREIGN PATENT DOCUMENTS

WO 2007/075315 A1 7/2007

OTHER PUBLICATIONS

International Preliminary Report on Patentability for PCT Patent Application No. PCT/US2006/047147, mailed on Jul. 10, 2008, 7 pages.

(Continued)

*Primary Examiner* — Donghai D. Nguyen
(74) *Attorney, Agent, or Firm* — International IP Law Group, P.L.L.C.

(57) ABSTRACT

In some embodiments a high speed interconnect includes a layer of FR4 material, a trench in the layer of FR4 material, and a pair of transmission lines located near the trench. The trench is filled with a homogenous material. Other embodiments are described and claimed.

12 Claims, 4 Drawing Sheets

(56) References Cited

U.S. PATENT DOCUMENTS

| | | |
|---|---|---|
| 6,624,519 B1 | 9/2003 | Farrar |
| 6,630,629 B2 | 10/2003 | Otsuka et al. |
| 6,642,158 B1 | 11/2003 | Brist et al. |
| 6,672,902 B2 | 1/2004 | Skinner et al. |
| 6,674,648 B2 | 1/2004 | McCall et al. |
| 6,737,883 B2 | 5/2004 | Hall |
| 6,747,216 B2 | 6/2004 | Brist et al. |
| 6,788,222 B2 | 9/2004 | Hall et al. |
| 6,800,946 B2 | 10/2004 | Chason et al. |
| 6,803,527 B2 | 10/2004 | Dishongh et al. |
| 6,852,932 B2 | 2/2005 | Achari et al. |
| 6,882,762 B2 | 4/2005 | Brist et al. |
| 6,891,899 B2 | 5/2005 | Hall et al. |
| 6,916,183 B2 | 7/2005 | Alger et al. |
| 6,992,899 B2 | 1/2006 | Alger et al. |
| 7,020,792 B2 | 3/2006 | Hall |
| 7,022,919 B2 | 4/2006 | Brist et al. |
| 7,043,706 B2 | 5/2006 | Brist et al. |
| 7,064,063 B2 | 6/2006 | Brist et al. |
| 7,121,841 B2 | 10/2006 | Alger et al. |
| 7,145,243 B2 | 12/2006 | Brist et al. |
| 7,269,899 B2 | 9/2007 | Brist et al. |
| 7,372,144 B2 * | 5/2008 | Dutta .................. 257/664 |
| 7,373,068 B2 | 5/2008 | Mershon et al. |
| 7,480,435 B2 | 1/2009 | Brist et al. |
| 2003/0117786 A1 | 6/2003 | Chang et al. |
| 2003/0205407 A1 | 11/2003 | Brist et al. |
| 2004/0135656 A1 | 7/2004 | Sinsheimer et al. |
| 2004/0155733 A1 | 8/2004 | Chen et al. |
| 2004/0173822 A1 | 9/2004 | Dutta |
| 2004/0174223 A1 | 9/2004 | Achyut |
| 2005/0063637 A1 | 3/2005 | Mershon et al. |
| 2005/0063638 A1 | 3/2005 | Alger et al. |
| 2005/0208749 A1 | 9/2005 | Beckman et al. |
| 2005/0221066 A1 | 10/2005 | Brist et al. |
| 2005/0241850 A1 | 11/2005 | Cannon et al. |
| 2006/0123371 A1 | 6/2006 | Brist et al. |
| 2006/0148281 A1 | 7/2006 | Horine et al. |
| 2006/0258184 A1 | 11/2006 | Alger et al. |
| 2007/0000687 A1 | 1/2007 | Brist et al. |
| 2007/0001789 A1 | 1/2007 | Suarez-Gartner et al. |
| 2007/0001907 A1 | 1/2007 | Hall et al. |
| 2007/0025667 A1 | 2/2007 | Mershon et al. |
| 2007/0037432 A1 | 2/2007 | Mershon et al. |
| 2007/0110388 A1 | 5/2007 | Alger et al. |
| 2007/0154155 A1 | 7/2007 | Brist et al. |
| 2007/0154156 A1 | 7/2007 | Brist et al. |
| 2007/0154157 A1 | 7/2007 | Horine et al. |
| 2007/0274656 A1 | 11/2007 | Brist et al. |

OTHER PUBLICATIONS

International Search Report and Written Opinion of the International Searching Authority for PCT Patent Application No. PCT/US2006/047147, mailed on Apr. 11, 2007, 11 Pages.

* cited by examiner

METHOD OF FORMING A HIGH SPEED INTERCONNECT

RELATED APPLICATION

This application is a divisional of U.S. patent application Ser. No. 11/319,875 filed on Dec. 30, 2005, now abandoned.

TECHNICAL FIELD

The inventions generally relate to a high speed interconnect.

BACKGROUND

In computer systems, boards (or printed circuit boards) such as motherboards and daughter cards, for example, are typically fabricated to hold computer components such as processors, chipsets, memory, etc. The boards also include features such as interconnects (for example, bus interconnects) that are used to electrically connect the various components. As bus data rates continue to scale (for example, in proportion to Moore's Law), the traditional materials used to fabricate boards such as motherboards and daughter cards begin to exhibit severe interconnect performance limitations. As frequencies increase, these limitations become one of the primary roadblocks to data rates above 8-10 Gb/s for server and desktop systems, for example.

Printed Circuit Boards (PCBs) used in the fabrication of virtually all volume motherboards and daughter cards in the Personal Computer (PC) industry begin to introduce severe performance problems for high speed interconnect channels (for example, PCI-express). These performance limitations are generally dominated by two properties of the FR4 material used to fabricate these boards. These two properties include material loss and non-homogeneous dielectric issues. Therefore, a need has arisen for boards such as motherboards and/or daughter cards that do not include performance limitations for high speed interconnect channels.

BRIEF DESCRIPTION OF THE DRAWINGS

The inventions will be understood more fully from the detailed description given below and from the accompanying drawings of some embodiments of the inventions which, however, should not be taken to limit the inventions to the specific embodiments described, but are for explanation and understanding only.

DETAILED DESCRIPTION

Some embodiments of the inventions relate to a high speed interconnect.

Some embodiments relate to a high performance transmission line for high data rates.

In some embodiments a high speed interconnect includes a layer of FR4 material, a trench in the layer of FR4 material, and a pair of transmission lines located near the trench. The trench is filled with a homogenous and/or low loss material.

In some embodiments a system includes a first device, a second device, and a high speed interconnect to propagate a signal between the first device and the second device. The high speed interconnect includes a layer of FR4 material, a trench in the layer of FR4 material, and a pair of transmission lines located near the trench. The trench is filled with a homogenous and/or low loss material.

In some embodiments a method of forming a high speed interconnect includes creating a trench in a layer of FR4 material, inserting a homogenous and/or low loss material into the trench, and forming a pair of transmission lines near the trench.

According to some embodiments, Printed Circuit Boards (PCBs) used in the fabrication of virtually all volume boards (for example, motherboards and daughter cards in the computing and communications industries) begin to exhibit severe interconnect performance problems for high speed interconnect channels, including material losses and non-homogenous dielectric issues.

Figure 1:
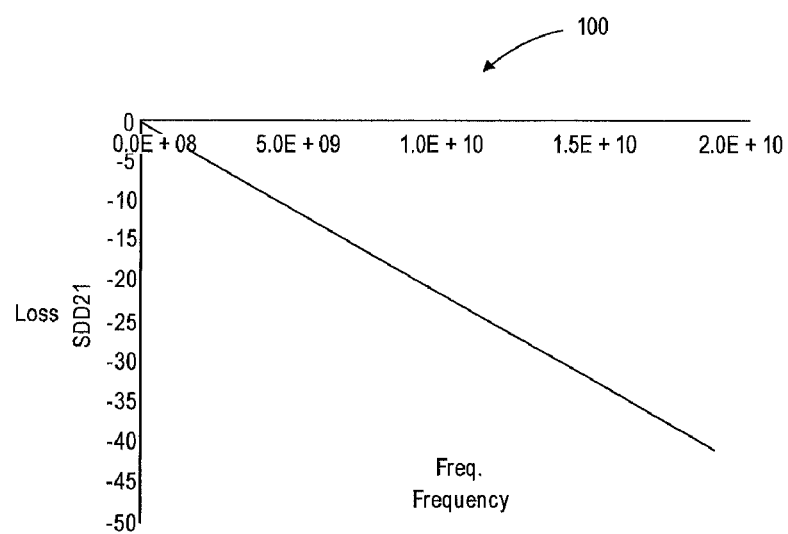
FIG. 1 illustrates a graph 100 showing material losses in order to explain some embodiments of the inventions.

FIG. 1 illustrates a graph 100 showing material losses due to interactions between a dielectric material (for example, FR4 material) and an electric field of a signal propagating on a transmission line. More specifically, graph 100 illustrates losses that a transmission line routed on FR4 material will induce for a 20 inch differential pair. For example, graph 100 illustrates exemplary measured differential insertion loss over a 20 inch differential pair (microstrip). The material losses are specified by the loss tangent, which is a measure of the "equivalent conductivity" of the material at a given frequency. The loss tangent (Tan D) of FR4 is approximately 0.017, which will induce approximately 25 dB of signal loss over a 20 inch trace at 10 GHz (as illustrated in graph 100). This corresponds to a 20 Gbit/s data transmission rate. Consequently, in this example, the signal will be attenuated approximately 95% by the FR4 material properties alone as it propagates from the driver to the receiver. This loss will quickly close the eye seen at the receiver.

Figure 2:
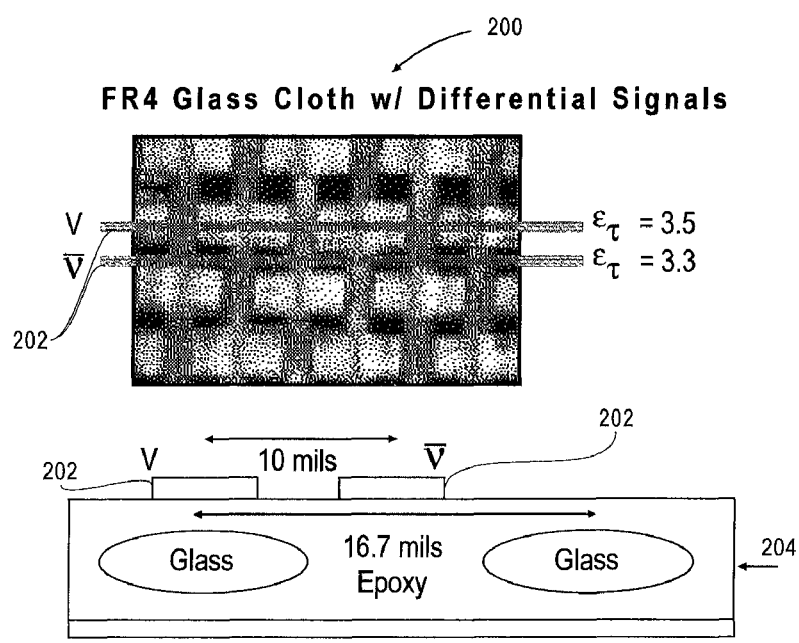
FIG. 2 illustrates a differential pair imbalance 200 in order to explain some embodiments of the inventions.

FIG. 2 illustrates a differential pair imbalance 200 due to non-homogeneous material. Differential pair transmission lines 202 are shown in a top view at the top of FIG. 2 and a side view at the bottom of FIG. 2. Transmission lines 202 are near (over) a layer of FR4 material 204 illustrated at the bottom of FIG. 2. The FR4 material 204 is shown at the bottom of FIG. 2 as containing an epoxy portion (dark) and a glass portion (oval). A differential pair imbalance is caused by the non-homogeneous nature of the FR4 material (see, for example, how the left transmission line 202 at the bottom of FIG. 2 is near the glass material of the FR4 layer 204 and the right transmission line 202 at the bottom of FIG. 2 is near the epoxy material of the FR4 layer 204).

At high frequency rates, it is necessary to use a differential pair (for example, 202 in FIG. 2) to facilitate the propagation of a data signal from a driver (for example, a microprocessor) to a receiver (for example, a chipset). Differential pair transmission line design requires that each signal in the pair be identical. The FR4 material of layer 204 is a composite manufactured by gluing sheets of fiberglass cloth together. This can, and very often does, create an imbalance between the legs of the differential pair 202 because it is possible for one leg to be routed over a glass bundle and the other leg to be routed over an epoxy trough. Since the dielectric constant between the glass (Er~6) and epoxy (Er~3) is high, this creates a significant imbalance within the pair 202.

The imbalance causes a differential to common mode conversion, otherwise known as AC common mode noise (ACCM). The ACCM noise induced by the non-homogenous FR4 material 204 directly reduces the signal amplitude seen at the receiver (eye height) and introduces significant timing errors (eye width) that will easily destroy the signal integrity if not controlled.

According to some embodiments a solution is provided to the dominant problems associated with propagating high speed signals on transmission lines built on traditional FR4 materials. According to some embodiments the performance of FR4 based channels is significantly increased and data rates are enabled that are greater than 10-15 Gb/s while preserving the use of low cost FR4 material as a primary material for the board (for example, motherboard).

According to some embodiments a trench is formed into FR4 material (for example, by laser etching or milling) and the trench is filled with a low loss and/or homogenous dielectric material prior to bonding of the copper layer and prior to etching of the transmission lines. This allows for a minimizing of signal degradation caused by losses and AC common mode noise.

Figure 3:
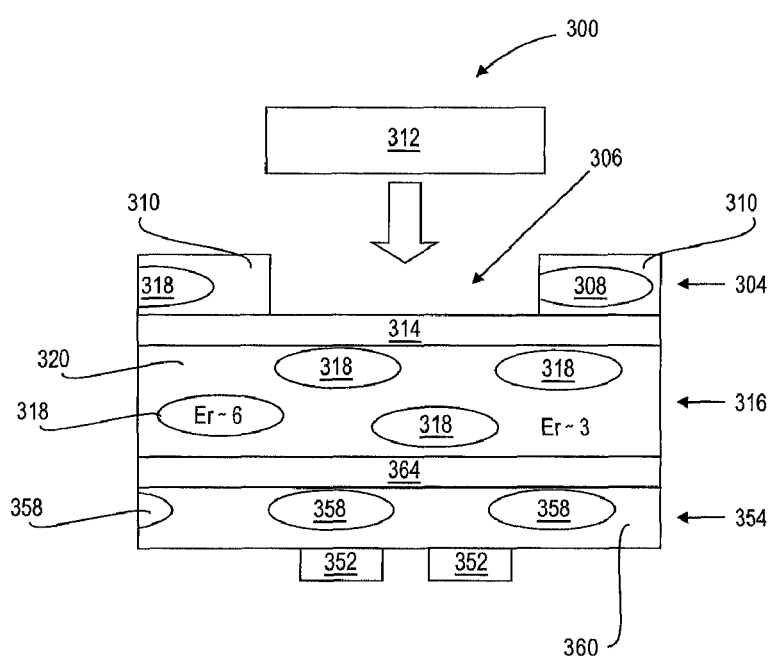
FIG. 3 illustrates an interconnect 300 according to some embodiments of the inventions.

FIG. 3 illustrates an interconnect 300 according to some embodiments. According to some embodiments the interconnect 300 is located on a board. According to some embodiments interconnect 300 includes an FR4 material layer 304, a trench 306 formed in the FR4 material layer 304, glass portions 308 of FR4 material layer 304, epoxy portions 310 of FR4 material layer 304, a controlled material 312 inserted into trench 306, a copper layer 314, and/or an FR4 core 316 including glass bundle portions 318 (for example, Er~6) and epoxy portions 320 (for example, Er~3). According to some embodiments additional portions include transmission lines 352, an FR4 material layer 354 including glass portions 358 and epoxy portions 360, and a copper layer 364.

According to some embodiments an interconnect 300 is formed by forming the trench 306 in the FR4 material 304 and filling trench 306 with the controlled material 312. According to some embodiments trench 306 is filled with the controlled material 312 prior to the attachment of a copper foil above trench 306 and/or prior to adding any transmission lines near (for example, over) the trench 306, controlled material 312, and/or FR4 material 304. A copper foil is later attached above controlled material 312 in trench 306 and plated in order to form conductors (for example, differential pair transmission lines) above the trench 306 (not shown in FIG. 3). According to some embodiments the trench 306 is formed in a cured FR4 material 304. According to some embodiments the trench 306 is milled out of the FR4 material 304. According to some embodiments the trench 306 is laser etched out of the FR4 material 304. According to some embodiments the controlled material 312 that is inserted into the trench 306 is a low loss and/or homogeneous material. According to some embodiments the controlled material 312 that is inserted into the trench 306 is a low loss and/or homogeneous dielectric material.

Figure 4:
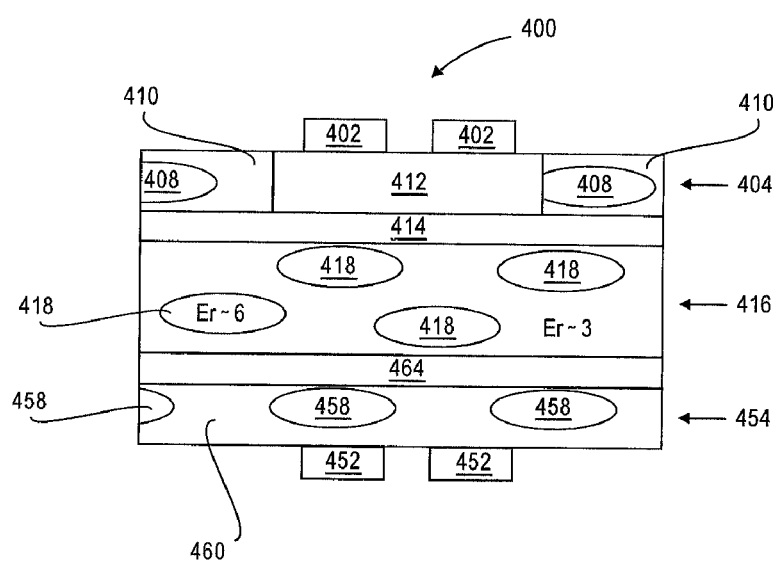
FIG. 4 illustrates an interconnect 400 according to some embodiments of the inventions.

FIG. 4 illustrates an interconnect 400 according to some embodiments. According to some embodiments the interconnect 400 is located on a board. According to some embodiments interconnect 400 includes transmission lines 402, an FR4 material layer 404, a trench 406 formed in the FR4 material layer 404, glass portions 408 of FR4 material layer 404, epoxy portions 410 of FR4 material layer 404, a controlled material 412 inserted into trench 406, a copper layer 414, and/or an FR4 core 416 including glass bundle portions 418 (for example, Er~6) and epoxy portions 420 (for example, Er~3). According to some embodiments additional portions include transmission lines 452, an FR4 material layer 454 including glass portions 458 and epoxy portions 460, and a copper layer 464.

According to some embodiments an interconnect 400 is formed by forming the trench 406 in the FR4 material 404 and filling trench 406 with the controlled material 412. According to some embodiments trench 406 is filled with the controlled material 412 prior to the attachment of copper conductors and/or transmission lines 402 near (for example, over) the trench 406, controlled material 412, and/or FR4 material 404. The copper conductors are attached above the controlled material 412 after it has been inserted in trench 406. The copper is plated and/or laminated in order to form conductors 402 (for example, differential pair transmission lines) above the trench 406. According to some embodiments the trench 406 is formed in a cured FR4 material 404. According to some embodiments the trench 406 is milled out of the FR4 material 404. According to some embodiments the trench 406 is laser etched out of the FR4 material 404. According to some embodiments the controlled material 412 that is inserted into the trench 406 is a low loss and/or homogeneous material. According to some embodiments the controlled material 412 that is inserted into the trench 406 is a low loss and/or homogeneous dielectric material.

According to some embodiments, once the trench 406 is created and the controlled material 412 is inserted a copper foil is attached to the top of controlled material 412. The copper foil is then etched and plated to form signal conductors 402 (for example, transmission lines) that are used, for example, as a differential pair. According to some embodiments controlled material 412 is a high performance material, thus providing a localized high performance differential pair of transmission lines 402.

According to some embodiments a variety of materials may be chosen for insertion into a trench (for example, different materials for controlled material 312 of FIG. 3 and/or controlled material 412 of FIG. 4). According to some embodiments different materials may be inserted into a trench depending on desired electrical properties of the transmission line and/or differential pair.

According to some embodiments different exemplary materials that may be inserted into a trench formed in an FR4 layer include but are not limited to one or more of the following materials.

According to some embodiments an epoxy is inserted into a trench. Although epoxy is used to manufacture FR4 boards it is not always necessarily a low loss material. However, epoxy is a homogeneous material. According to some embodiments it is relatively easy and cost efficient to create a trench for a high speed transmission line that is filled with epoxy, for example, in order to eliminate ACCM effects. This is particularly useful for very high frequency channels that are, for example, less than approximately 6 inches in length. Since the length is short the losses are less consequential and ACCM noise is limited.

According to some embodiments Teflon is inserted into a trench. The loss tangent of Teflon is 0.0004, which is over 40 times less lossy than FR4. Teflon is homogenous so it produces an excellent high speed channel. Both the dielectric losses and ACCM are almost negligible using Teflon in such a manner. The speed of such a transmission line is therefore only limited by copper losses and impedance discontinuities.

According to some embodiments Nylon is inserted into a trench. Nylon is approximately 40% less lossy than FR4. Nylon can also be made to be homogeneous.

According to some embodiments, solid materials such as ceramic or alumina are inserted into a trench (although there may be some difficulties associated with inserting such materials into an FR4 trench, they may still be used in some embodiments). Ceramic is approximately 4 times less lossy than FR4, and ceramic is a homogeneous material.

According to some embodiments any low loss material is inserted into a trench. According to some embodiments any material having a loss that is lower than a loss of FR4 material is inserted into a trench.

According to some embodiments the useful life of copper interconnects may be dramatically increased by reducing the dielectric losses and the non-homogeneous nature of typical FR4 material.

According to some embodiments two of the top speed limiters of current FR4 material based channels are eliminated (material losses and non-homogeneous material).

According to some embodiments the useful life of FR4 as the preferred high volume low cost material for board (for example, motherboard) manufacture is increased. Although there may be additional cost associated with some embodiments that cost is significantly less than changing the material of the entire board (for example, motherboard, daughter card, and/or other boards).

According to some embodiments, very high speed buses may be implemented in a digital system (for example, according to some embodiments, memory buses and/or front side buses). Current research shows that currently used FR4 material will be difficult to use in designing buses with high transfer rates (for example, in some embodiments, in excess of 8-10 Gb/sec). Since loss and ACCM are two of the primary performance limiters on the interconnect channel, and the system speed is currently channel limited, according to some embodiments computers can be made to run faster. According to some embodiments interconnect speed will scale with Moore's Law.

According to some embodiments bus performance is optimized while minimizing system cost. The industry must currently live with the cost structure provided by FR4. However, according to some embodiments motherboards may be manufactured out of high performance materials to better facilitate data rates needed to keep up with processor speed. Although such high performance materials have proven to be too costly for the manufacture of volume motherboards, according to some embodiments the established low cost FR4 material is integrated with numerous high performance materials. According to some embodiments since high performance material may be used only for select, high speed interconnects and not the whole board, such integration produces the desired performance at a lower cost.

According to some embodiments as illustrated, for example, in FIG. 3 and FIG. 4, a board includes an interconnect (300, 400) on a top side of the board including transmission lines (402) located near a controlled material (312, 412) and an interconnect on a bottom side of the board including transmission lines (352, 452) not located near a controlled material but located near a typical FR4 material layer (354, 454). However, according to some embodiments the interconnect on the bottom side of the board also includes a controlled material similar to controlled material 312 located near transmission lines 352, 452 (for example, in a trench formed in layer 354, 454). In this manner a board can include two high speed interconnects, one at a top side of the board and one at the bottom side of the board according to some embodiments. Similarly, according to some embodiments a board includes only one interconnect (that is, a high speed interconnect).

Although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, the interfaces that transmit and/or receive signals, etc.), and others.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams and/or state diagrams may have been used herein to describe embodiments, the inventions are not limited to those diagrams or to corresponding descriptions herein. For example, flow need not move through each illustrated box or state, or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. A method of forming a high speed interconnect comprising:
    creating a trench in a layer of dielectric material on a top side of a board;
    inserting a homogenous material into the trench;
    forming a differential pair of transmission lines over the trench, wherein the differential pair of transmission lines extend over the trench;
    creating a second trench in a layer of dielectric material on a bottom side of the board;
    inserting the homogenous material into the second trench; and
    forming a second pair of transmission lines under the second trench.

2. The method of claim 1, wherein the trench in the layer of dielectric material is created by milling.

3. The method of claim 1, wherein the trench in the layer of dielectric material is created by laser etching.

4. The method of claim 1, wherein the differential pair of transmission lines are formed by etching.

5. The method of claim 1, wherein the homogenous material is at least one of an epoxy, Teflon, nylon, alumina, and ceramic.

6. The method of claim 1, wherein the homogenous material is a material that is less lossy than the dielectric material.

7. The method of claim 1, wherein the homogenous material is a low loss material.

8. The method of claim 1, wherein the high speed interconnect is a bus.

9. The method of claim 1, wherein homogenous material is a solid material.

10. The method of claim 9, wherein the solid material is at least one of an epoxy, Teflon, nylon, alumina, and ceramic.

11. The method of claim 1, wherein the trench extends through an entire height of the layer of dielectric material.

12. The method of claim 1, wherein the dielectric material is Flame Retardant 4 (FR4) material.

* * * * *